United States Patent
Ye et al.

(10) Patent No.: US 12,181,551 B2
(45) Date of Patent: Dec. 31, 2024

(54) MAGNETIC RESONANCE FINGERPRINTING IMAGING METHOD WITH VARIABLE NUMBER OF ECHOES

(71) Applicant: ZHEJIANG UNIVERSITY, Hangzhou (CN)

(72) Inventors: Huihui Ye, Hangzhou (CN); Jinmin Xu, Hangzhou (CN); Huafeng Liu, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 18/014,151

(22) PCT Filed: Nov. 18, 2022

(86) PCT No.: PCT/CN2022/132728
§ 371 (c)(1),
(2) Date: Dec. 31, 2022

(87) PCT Pub. No.: WO2023/093620
PCT Pub. Date: Jun. 1, 2023

(65) Prior Publication Data
US 2024/0103109 A1    Mar. 28, 2024

(30) Foreign Application Priority Data
Nov. 26, 2021  (CN) .......................... 202111421604.X

(51) Int. Cl.
*G01V 3/00*      (2006.01)
*G01R 33/48*     (2006.01)
(Continued)

(52) U.S. Cl.
CPC ....... *G01R 33/543* (2013.01); *G01R 33/4818* (2013.01); *G01R 33/4828* (2013.01); *G01R 33/5608* (2013.01)

(58) Field of Classification Search
CPC .............. G01R 33/3415; G01R 33/543; G01R 33/5659; G01R 33/36; A61B 5/055
(Continued)

(56) References Cited

FOREIGN PATENT DOCUMENTS

| CN | 104854446 A | * | 8/2015 | ............. G01R 33/56 |
| EP | 3296757 A1 | * | 3/2018 | ......... G01R 33/4818 |

* cited by examiner

*Primary Examiner* — Walter L Lindsay, Jr.
*Assistant Examiner* — Frederick Wenderoth
(74) *Attorney, Agent, or Firm* — Jiwen Chen; Joywin IP Law PLLC

(57) ABSTRACT

The present invention discloses a magnetic resonance fingerprinting imaging method with variable number of echoes, in addition to conventional MRF coding such as changing the excitation pulse angle, the method also introduces the change of the number of echoes, so that quantitative maps of $B_0$, $B_1+$, $T_1$ and $T_2^*$ can be obtained in a single scan. Further, if the echo time corresponding to the in-phase, opposed-phase and in-phase of water and fat is set for three consecutive echoes, the present invention can also image water and fat, and achieve the accurate quantification of $B_0$, $B_1+$, $T_1^w$, $T_1^F$, $[T_2^*]^w$ and $[T_2^*]^F$. Through in vivo experiments and simulations, the effectiveness of the present invention has been proved. Therefore, the present invention can provide multiple information representations for common brain diseases (glioma) and fatty diseases (such as lipoma, fatty liver, etc.), which is conducive to clinical diagnosis and treatment.

8 Claims, 4 Drawing Sheets

(51) Int. Cl.
*G01R 33/54* (2006.01)
*G01R 33/56* (2006.01)
(58) Field of Classification Search
USPC .......................................................... 324/309
See application file for complete search history.

MAGNETIC RESONANCE FINGERPRINTING IMAGING METHOD WITH VARIABLE NUMBER OF ECHOES

This is a U.S. national stage application of PCT Application No. PCT/CN2022/132728 under 35 U.S.C. 371, filed Nov. 18, 2022 in Chinese, claiming priority of Chinese Application No. 202111421604.X, filed Nov. 26, 2021, all of which are hereby incorporated by reference.

TECHNICAL FIELD

The present invention belongs to the technical field of magnetic resonance imaging, in particular to a magnetic resonance fingerprinting with variable number of echoes.

DESCRIPTION OF RELATED ART

Magnetic Resonance Fingerprinting (MRF) is a relatively accurate quantitative acquisition method of magnetic resonance imaging. MRF encodes signals by pseudo randomly varying the sequence parameters in one acquisition, and multiple quantitative parameter values of each pixel of the acquired image signal can be obtained by establishing a signal evolution dictionary, pattern matching and other steps. The parameters comprise the $T_1$(longitudinal relaxation time), $T_2$ and $T_2^*$(transverse relaxation times), etc, and these parameters are used to describe the physiological characteristics of tissues and organs, and have important significance and reference value for scientific research and clinical diagnosis. However, in the magnetic resonance imaging system, many factors will affect the accuracy of magnetic resonance fingerprinting imaging, the first factor is the system error: inhomogeneity of main magnetic field $B_0$ and RF magnetic field (radio frequency magnetic field) $B_1+$.

In order to solve the inhomogeneity problem of $B_0$, the shimming coil can be used to improve in terms of hardware, but depending on hardware has high cost, or it can be obtained by using IR trueFISP-MRF and other related sequences, but the results have banding artifacts. In order to solve the inhomogeneity problem of $B_1$, in terms of hardware, the parallel transmitting system can be used to embed the influence of $B_1+$ into the system flow of MRF, or additionally collecting the distribution map of $B_1+$ to improve the quantitative accuracy of MRF. In the same MRF sequence, considering system parameter $B_0$, $B_1+$ and tissue parameters $T_1$ and $T_2^*$ is worth exploring. In order to quantify the four parameters at the same time, based on the scanning parameters of the magnetic resonance fingerprinting imaging change sequence, such as flip angle (FA), repetition time (TR) and echo time (TE), change parameter is proposed to increase the random change range and coding dimension of the sequence, namely the number of echoes. At present, the existing research often uses a fixed number of echoes, such as one echo in all TRs.

Another source that will affect the quantitative accuracy of magnetic resonance fingerprinting is fat, the resonance frequency of fat has a certain frequency shift relative to water, and the relaxation time of the two is also different, therefore, the signal actually collected is the sum of the signals of water and fat, if fat is ignored, the quantitative accuracy of adipose tissue will be affected. At present, the main solutions comprise the following two: the first is to use a multi-component model to represent the fat and water signals, and then building a huge dictionary to match the obtained signals. The dictionary will contain the respective parameters of fat and water ($T_1$, $T_2$, etc.), and finally obtaining the parameter distribution map of interest through dictionary matching, this method is very time-consuming, and is often combined with some dictionary compression methods to speed up. The second method is to use classical water-fat separation methods, such as Dixon, collecting in-phase and opposed-phase signals of water and fat by collecting multiple echoes to pre separate the signals of fat and water, and then performing dictionary matching for water and fat respectively.

SUMMARY OF THE INVENTION

In view of the above, the present invention provides a magnetic resonance fingerprinting imaging method with variable number of echoes, $B_0$, $B_1+$, $T_1$ and $T_2^*$ can be quantified at the same time by changing the number of echoes used in different TRs.

A magnetic resonance fingerprinting imaging method with variable number of echoes, comprising the following steps:

(1) designing and generating a magnetic resonance fingerprinting imaging sequence based on variable number of echoes according to a required quantitative tissue parameters and system parameters, the tissue parameters comprise longitudinal relaxation time $T_1$ and transverse relaxation time $T_2^*$, the system parameters comprise main magnetic field $B_0$ and RF magnetic field (radio frequency magnetic field) $B_1+$;

(2) importing the magnetic resonance fingerprinting imaging sequence into a magnetic resonance scanner, scanning a subject to obtain the original k-space data;

(3) reconstructing the original k-space data to obtain a series of images;

(4) giving a required quantitative dynamic variation range and discretization step of tissue parameters and system parameters, a dictionary reflecting the temporal variation of echo signal is established based on Bloch equation;

(5) matching the temporal variation signal of each pixel of the reconstructed images in step (3) with the echo signal in the dictionary one by one, so as to obtain the specific tissue parameter values for each pixel, and then obtain the quantitative image of the above tissue parameters and system parameters.

Further, the magnetic resonance fingerprinting imaging sequence designed in step (1) is based on a spoiled gradient recalled echo sequence prepared by an inversion pulse, mainly comprising an inversion pulse excitation module and a gradient recalled echo signal acquisition module with variable number of echoes. In the gradient recalled echo signal acquisition module with variable number of echoes, the duration of each TR (that is, from the starting time of one pulse to the starting time of the next pulse) is not exactly the same, and the number of echoes contained in each TR is not exactly the same, at the same time, the flip angle of the excitation pulse used by each TR and the echo time TEs (that is, the time from the echo occurrence time to the starting time of this TR) in the same TR is necessary to be optimized.

Further, Bloch equation describes the magnetic resonance fingerprinting imaging sequence designed in step (1), giving the tissue parameters and system parameters of the required quantitative, giving the sequence parameters as the input of Bloch equation, and outputting the echo signal time series reflecting the given parameters under the designed magnetic resonance fingerprinting imaging sequence, the sequence parameters comprise TR duration, FAs, the number of echoes used in each TR and TEs of each echo.

Further, some TRs of the gradient recalled echo signal acquisition module with variable number of echoes use four echoes, and the corresponding TR is a long TR module, other TRs use one echo, and the corresponding TR is a short TR module, the adjacent short TR module and long TR module form a dual TR module.

Further, the duration of the short TR is 12 ms, the duration of the long TR is 48 ms.

Further, when the method of the present invention is applied to the water-fat separation imaging, the first three echoes in the long TR module have the water-fat in-phase, water-fat opposed-phase and water-fat in-phase echo times (TE) respectively.

Further, the TEs of the four echoes in the long TR are 2.4 ms, 13.2 ms, 24 ms and 31 ms, the TEs of the echo in the short TR is 2.4 ms.

Further, when the method of the present invention is applied to the water-fat separation imaging, after a series of images are reconstructed in step (3), the Dixon method is used to decompose the images into water signal map, fat signal map and main magnetic field $B_0$ distribution map. Further using the water signal map and fat signal map to calculate the fat fraction distribution map through the following formula, and incorporating the fat fraction into Bloch equation;

$$FF = \frac{F}{F + W}$$

wherein, FF is the fat fraction, F is the fat signal, and W is the water signal.

In addition to conventional MRF coding such as changing the excitation pulse angle, the method of the present invention also introduces the change of the number of echoes, so that a quantitative maps of $B_0$, $B_1+$, $T_1$ and $T_2^*$ can be obtained by a single scan. Further, if the echo time corresponding to the in-phase, opposed-phase and in-phase of water and fat is set for three consecutive echoes, the present invention can also image water and fat, and achieve the accurate quantification of $B_0$, $B_1+$, $T_1^w$, $T_1^F$, $[T_2^*]^w$ and $[T_2^*]^F$. Through in vivo experiments and simulations, the effectiveness of the present invention has been proved. Therefore, the present invention can provide multiple information representations for common brain diseases (glioma) and fatty diseases (such as lipoma, fatty liver, etc.), which is conducive to clinical diagnosis and treatment.

DETAILED DESCRIPTION OF THE INVENTION

In order to describe the present invention more specifically, the counting scheme of the present invention will be described in detail below in combination with the drawings and specific embodiments.

Figure 1:
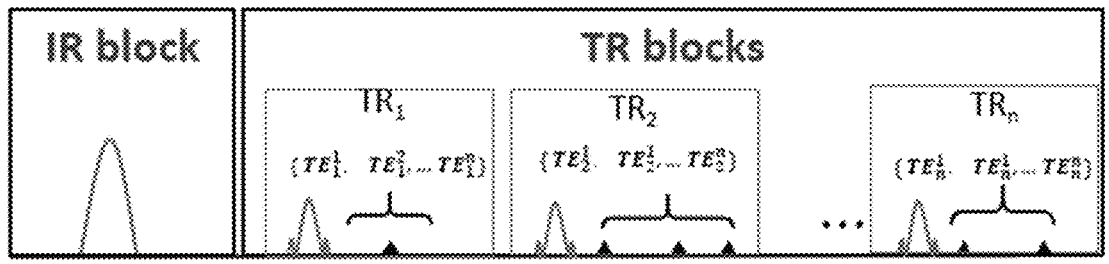
FIG. 1 is a schematic diagram of magnetic resonance fingerprinting imaging sequence with variable number of echoes in the present invention.

The core of the present invention is to design and realize a magnetic resonance fingerprinting imaging sequence with variable number of echoes, the key of MRF with variable number of echoes lies in the difference of the number of echoes in each TR, as shown in FIG. 1, the duration of each TR is different, and the number of echoes included is also different. Therefore, in addition to the optimization of the flip angles (FAs, Flip Angles), repetition times (TRs), and echo times (TEs) of RF pulses in traditional methods, the number of echoes and other parameters need to be designed and optimized in the specific implementation process.

The specific implementation of the magnetic resonance fingerprinting imaging method in this embodiment mainly comprises two parts: the design of MRF sequence with variable echo number, and data acquisition and processing.

The Design of MRF Sequence with Variable Echo Number

Figure 2:
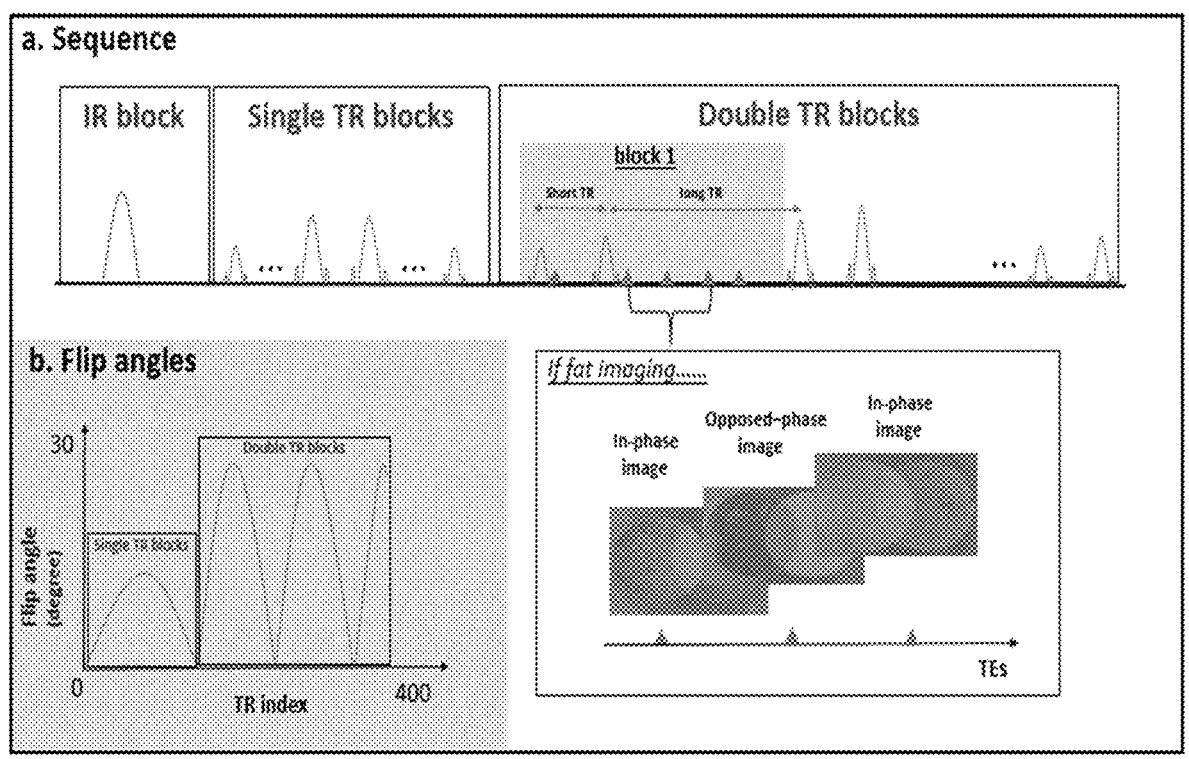
FIG. 2a is a schematic diagram of an embodiment of MRF sequence with variable number of echoes in the present invention.
FIG. 2b is a schematic diagram of the excitation pulse angle corresponding to each TR in the MRF sequence with variable number of echoes embodiment in the present invention.

FIG. 2a shows the basic structure of the sequence, the sequence consists of two parts, an inversion pulse excitation module and a signal acquisition module with variable number of echoes.

(1) The inversion pulse excitation module comprises a 180 degree RF excitation pulse and several excitation pulses with variable angle, the TR corresponding to these variable angle excitation pulses is 12 ms, and the angle is shown in FIG. 2b, which is a half sine waveform, the inversion pulse excitation module is mainly used to encode $T_1$ and $B_1+$.

(2) The signal acquisition module with variable number of echoes is mainly composed of multiple dual TR modules, each dual TR module further encodes the signal by combining a short TR (12 ms) module and a long TR (48 ms) module. In the short TR module, TE is 2.4 ms, which is a constant value. In the long TR, collecting echo signals of four different TEs. If the long TR is applied to the quantitative imaging of fat and water, the TE is 2.4 ms, 13.2 ms, 24 ms and 31 ms, where, the first three signals correspond to the in-phase, opposed-phase and in-phase conditions of water and fat signals respectively, which meet the conditions of Dixon method and can separate water and fat. The signal acquisition module with variable number of echoes is mainly used to encode $T_1$ and $T_2^*$, in the signal acquisition module with variable number of echoes, the excitation angle also changes, as shown in FIG. 2b.

Data Acquisition and Processing

The sequence is a general MRF sequence with variable number of echoes, which can realize quantitative imaging of $B_0$, $B_1+$, $T_1$ and $T_2^*$. In particular, when the first three echo times of the long TR module are water-fat in-phase, water-fat opposed-phase and water-fat in-phase, the sequence can also be used for simultaneous quantitative imaging of fat and water to generate a distribution map of $B_0$, $B_1+$, $T_1^w$, $T_1^F$, $[T_2^*]^w$ and $[T_2^*]^F$. In order to explain the data acquisition and processing flow of these two applications in detail, they are described separately.

(1) The General MRF Sequence with Variable Number of Echoes

The sequence conducts data acquisition and processing in the human brain, and uses the trajectory of spiral to collect (36 interleaves), the field of vision FOV is 220 mm, the resolution is 1 mm, and the entire acquisition process is about 12 ms, thus obtaining k-space data.

Next is the establishment of a dictionary; In the whole signal processing process of MRF with variable number of echoes, the most important step is to establish the dictionary, which is also one of the most critical steps in the traditional MRF process. The dictionary, as its name implies, is a book containing all information, all possible information can be found in the dictionary. Similarly, the basic principle of magnetic resonance fingerprinting imaging is to establish a fingerprint database containing all possible MRF signals to match with the actually collected signals. Once the fingerprint with the highest consistency with the measured signal is found in the fingerprint database, its corresponding tissue parameters can be indexed to achieve quantitative imaging, the fingerprint here is actually the time evolution curve of MRF signal. The specific creation process of the dictionary is as follows: firstly, limiting a variation range of various parameters, such as $T_1$(200:10:2300 ms), $T_2^*$(50:5:600 ms) and $B_1$(0:0.1:1.4); Then, based on Bloch equation, all possible time evolution curves are calculated according to the dynamic range of different parameters, and the set of this time evolution curve is a dictionary.

Figure 3:
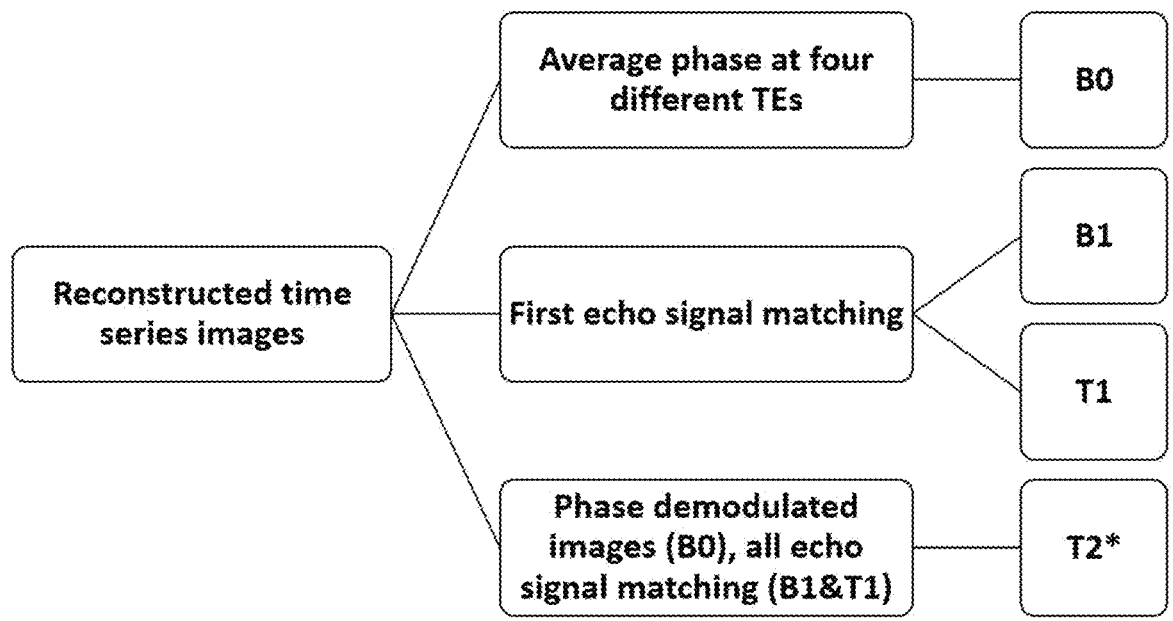
FIG. 3 is a schematic diagram of the data processing flow of the MRF sequence with variable number of echoes embodiment.

Finally, signal processing and matching. The K-space data will be reconstructed into a series of images under the action of non-uniform inverse fourier transform. As shown in FIG. 3, after averaging the images corresponding to the same TE, the average images corresponding to different TE can be obtained, and then $B_0$ can be obtained. In order to reduce the difficulty of dictionary matching as much as possible, the first echo signal of each TR is extracted for signal matching to obtain the distribution map of $B_1+$ and $T_1$. Finally, the calculated $B_0$, $B_1+$ and $T_1$ are substituted into the generated dictionary, and finally matching all signals to obtain $T_2^*$. So far, $B_0$, $B_1+$, $T_1$ and $T_2^*$ can be obtained.

Figure 4:
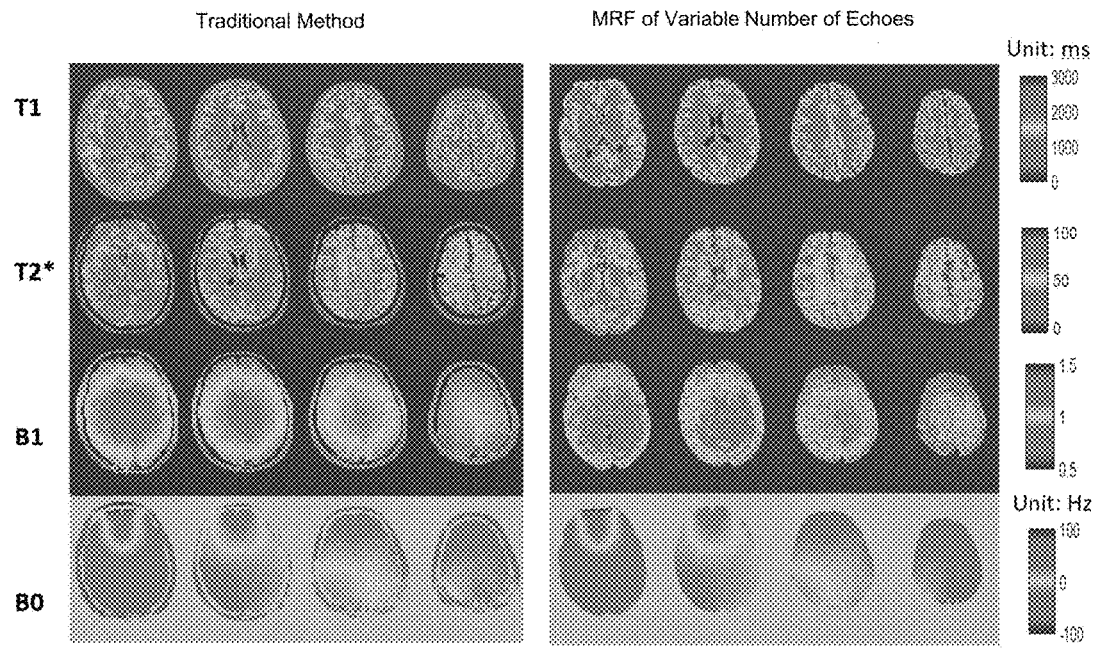
FIG. 4 is a schematic diagram of the experimental results of MRF sequence with variable number of echoes on human body.

The left column of FIG. 4 shows the quantitative results of each parameter by the traditional gold standard method, and the right column shows the MRF results of the present invention with variable number of echoes. For traditional methods, from top to bottom, the sequences corresponding to $T_1$, $T_2^*$, $B_1+$ and $B_0$ are MP2RAGE, Multi TE GRE, turboFLASH B1 and Two-echo GRE, respectively.

(2) MRF Sequence with Variable Number of Echoes for Water-Fat Quantification

Figure 5:
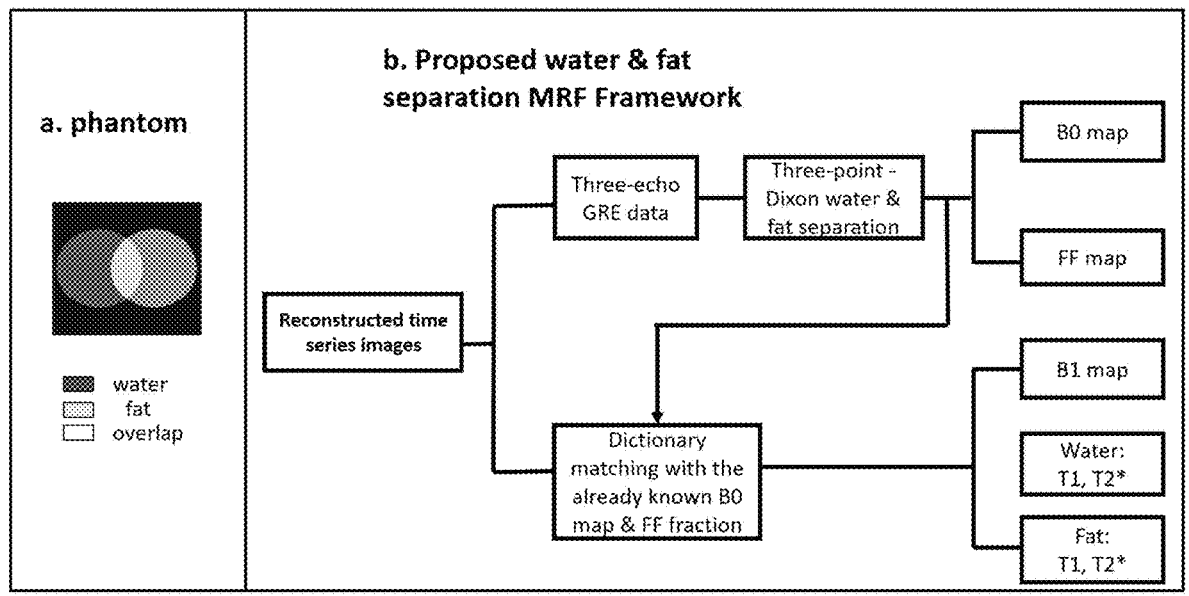
FIG. 5a shows a digital phantom used in the simulation experiment when the MRF sequence with variable number of echoes embodiment in the present invention is applied to the water-fat imaging.
FIG. 5b is a schematic diagram of the data processing flow when the MRF sequence with variable number of echoes in the present invention is applied to the water-fat imaging.

On the basis of the general MRF sequence with variable number of echoes, this sequence further defines the value of TE to make it meet the conditions of Dixon method, so as to preliminarily separate water and fat, as shown in FIG. 5a, a simple digital phantom is used for simulation experiments. In order to simplify the experiment, three regions of interest are designed, namely, a water only region, a fat only region, and a mixture region of water and fat, different value of $T_1$ and $T_2^*$ and initial density are set for water and fat, the digital template will be used as an input of the whole method to check the effectiveness of the proposed method. In order to simulate the process of MRF signal generation, Bloch equation is used in MATLAB to simulate the k-space signal generated by the actual magnetic resonance instrument scanning according to the proposed sequence, and the acquisition trajectory of spiral is adopted, there are 36 interleaves in total, which takes about 12 ms; Then, the signal is reconstructed using non-uniform inverse Fourier transform to generate a series of dynamically changing images, the subsequent processing flow is shown in FIG. 5b.

As mentioned above, the first three signals in the dual TR signal acquisition module correspond to the situations that water and fat signals are in-phase, opposed-phase and in-phase. Therefore, Dixon method can be used to process them to obtain water images W, fat images F and $B_0$ distribution map, then the distribution map of FF can be obtained by the following formula:

$$FF = \frac{F}{F+W}$$

For each echo time TE, the obtained signal can be expressed as:

$$S(TE) = M_0[(1-FF) + FF \sum_{n=1}^{N} \alpha_n e^{j2\pi \Delta f_n TE}] e^{j2\pi B_0 TE}$$

Where, $M_0$ is the magnetization of the equilibrium state of water and fat molecules, FF is the fat fraction, $$\sum_{n=1}^{N} \alpha_n e^{j2\pi \Delta f_n TE}$$

is a fat model with multiple peaks, corresponding to the Nth peak, $\alpha_n$, $\Delta f_n$ is its weight coefficient and chemical shift relative to water, $B_0$ is the non-uniform magnetic field, which is obtained by Dixon method. For simplicity, the relaxation coefficients of water and fat are omitted, which are $T_1^w$, $T_1^F$, $[T_2^*]^w$, $[T_2^*]^F$ and the non-uniformity of RF field $B_1+$.

The specific creation process of the dictionary is as follows: Firstly, limiting the variation range of various parameters, such as $T_1$(200:10:2300 ms), $T_2^*$(50:5:600 ms), $B_1$(0:0.1:1.4), for water and fat, the range of $T_1$ and $T_2^*$ can be set to different ranges and steps according to the situation. Then, based on Bloch equation and the above formula, all possible time evolution curves can be calculated according to the dynamic range of different parameters. The set of time evolution curves is the dictionary.

The last step is signal matching; To sum up, we have obtained the reconstructed signal and dictionary, and need to perform pixel by pixel dictionary matching on the reconstructed image. The specific method is to calculate the inner product of the reconstructed signal and the signal set in the dictionary in turn, the largest inner product is the matched signal, and its corresponding parameter is the parameter value of the pixel, then the distribution maps of quantitative parameters ($T_1^w$, $T_1^F$, $[T_2^*]^w$, $[T_2]^F$, $B_1$) corresponding to the whole image can be obtained, combining the obtained FF distribution map and $B_0$ distribution map, the method of the present invention can be used to completely quantify water, fat and various parameters of the system.

Figure 6:
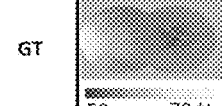
FIG. 6 is the schematic diagram of the simulation experiment results of MRF sequence with variable number of echoes in the present invention is applied to the water-fat imaging.

FIG. 6 shows the simulation results. In the FIG. 6, the first row is the real value, and the second row is the result of dictionary matching. From left to right, they are: $B_0$, $B_1+$, FF, $T_1^w$, $[T_2]^w$, $T_1^F$ and $[T_2^*]^F$, it can be seen from the results that the method of the present invention can preliminarily realize the quantification of various parameters of water and fat.

The above description of embodiments is for the convenience of ordinary technicians in the technical field to understand and apply the present invention. It is obvious that those skilled in the art can easily make various modifications to the above embodiments, and apply the general principles described herein to other embodiments without creative labor. Therefore, the present invention is not limited to the above embodiments. According to the disclosure of the present invention, those skilled in the art should make improvements and modifications to the present invention within the protection scope of the present invention.

The invention claimed is:

1. A computer-implemented magnetic resonance fingerprinting imaging method with variable number of echoes, wherein, comprising the following steps:
    (1) designing and generating a magnetic resonance fingerprinting imaging sequence based on variable number of echoes according to a required quantitative tissue parameters and system parameters, the tissue parameters comprise longitudinal relaxation time $T_1$ and transverse relaxation time $T_2^*$, the system parameters comprise main magnetic field inhomogeneity $B_0$ and RF magnetic field (radio frequency magnetic field) $B_1+$;
    (2) importing the magnetic resonance fingerprinting imaging sequence into a magnetic resonance scanner, scanning a subject to obtain the original k-space data;
    (3) reconstructing the original k-space data to obtain a series of images;
    (4) giving a required quantitative dynamic variation range and discretization step of tissue parameters and system parameters, a dictionary reflecting the temporal variation of echo signal is established based on Bloch equation;
    (5) matching the temporal variation signal of each pixel of the reconstructed images in step (3) with the echo signal in the dictionary one by one, so as to obtain the specific tissue parameter values for each pixel, and then obtain the quantitative image of the above tissue parameters and system parameters;
    (6) saving the quantitative image of the above tissue parameters and system parameters in a database for viewing.

2. The computer-implemented magnetic resonance fingerprinting imaging method according to claim 1, wherein, the magnetic resonance fingerprinting imaging sequence designed in the step (1) is based on a spoiled gradient recalled echo sequence prepared by an inversion pulse, mainly comprising an inversion pulse excitation module and a gradient recalled echo signal acquisition module with variable number of echoes; in the gradient recalled echo signal acquisition module with variable number of echoes, the duration of each TR is not exactly the same, and the number of echoes contained in each TR is not exactly the same, at the same time, the flip angle of the excitation pulse used by each TR and the echo time TEs in the same TR is necessary to be optimized.

3. The computer-implemented magnetic resonance fingerprinting imaging method according to claim 1, wherein, Bloch equation describes the magnetic resonance fingerprinting imaging sequence designed in the step (1), giving the tissue parameters and system parameters of the required quantitative, giving the sequence parameters as the input of Bloch equation, and outputting the echo signal time series reflecting the given parameters under the designed magnetic resonance fingerprinting imaging sequence, the sequence parameters comprise TR durations, flip angles, the number of echoes used in each TR and TEs of each echo.

4. The computer-implemented magnetic resonance fingerprinting imaging method according to claim 2, wherein, some TRs of the gradient recalled echo signal acquisition module with variable number of echoes use four echoes, and the corresponding TR is a long TR, other TRs use one echo, and the corresponding TR is a short TR, the adjacent short TR module and long TR module form a dual TR module.

5. The computer-implemented magnetic resonance fingerprinting imaging method according to claim 4, wherein, the duration of the short TR is 12 ms, the duration of the long TR is 48 ms.

6. The computer-implemented magnetic resonance fingerprinting imaging method according to claim 4, wherein, when the method is applied to the water-fat separation imaging, the first three echoes in the long TR modules have the water-fat in-phase, water-fat opposed-phase and water-fat in-phase echo times respectively.

7. The computer-implemented magnetic resonance fingerprinting imaging method according to claim 6, wherein, the TEs of the four echoes in the long TR are 2.4 ms, 13.2 ms, 24 ms and 31 ms, the TEs of the echo in the short TR is 2.4 ms.

8. The computer-implemented magnetic resonance fingerprinting imaging method according to claim 1, wherein, when the method is applied to the water-fat separation imaging, after a series of images are reconstructed in step (3), the Dixon method is used to decompose the images into water signal map, fat signal map and main magnetic field $B_0$ inhomogeneity map; further using the water signal map and fat signal map to calculate the fat fraction distribution map through the following formula, and incorporating the fat fraction into Bloch equation;

$$FF = \frac{F}{F+W}$$

wherein, FF is the fat fraction, F is the fat signal, and W is the water signal.

* * * * *